United States Patent
Miyajima et al.

[11] Patent Number: 5,309,106
[45] Date of Patent: May 3, 1994

[54] MAGNETIC FIELD GENERATOR

[75] Inventors: Goh Miyajima, Katsuta; Takao Takahashi, Hitachi; Takehiko Konno, Katsuta, all of Japan

[73] Assignees: Hitachi, Ltd., Tokyo; Hitachi Instrument Engineering Co., Ltd., Katsuta, both of Japan

[21] Appl. No.: 965,424

[22] Filed: Oct. 23, 1992

[30] Foreign Application Priority Data

Oct. 24, 1991 [JP] Japan .................................. 3-277454

[51] Int. Cl.$^5$ .............................................. G01V 3/00
[52] U.S. Cl. ...................................... 324/318; 324/319
[58] Field of Search ............... 324/322, 318, 319, 320; 335/304, 296; 336/84 M

[56] References Cited

U.S. PATENT DOCUMENTS

| | | | |
|---|---|---|---|
| 4,587,504 | 5/1986 | Brown et al. | 335/216 |
| 4,590,452 | 5/1986 | Ries et al. | 335/301 |
| 5,029,287 | 7/1991 | Martin et al. | 324/318 |

FOREIGN PATENT DOCUMENTS 60-98344 1/1985 Japan .

Primary Examiner—Louis Arana
Attorney, Agent, or Firm—Antonelli, Terry, Stout & Kraus

[57] ABSTRACT

Apparatus for cancelling magnetic fields for cancelling a leakage magnetic field from a static magnetic field generation assembly are disposed outside the static magnetic field generation assembly. A magnetic shield made of a magnetic substance is disposed between the static magnetic field generating assembly and the cancelling magnetic field apparatus. The cancelling magnetic field generation apparatus is of a cryostatless type.

17 Claims, 12 Drawing Sheets

MAGNETIC FIELD GENERATOR

BACKGROUND OF THE INVENTION

1. Field of the Invention

This invention relates to a static magnetic field generating system. More particularly, it relates to a static magnetic field generating system which can be used suitably in combination with a nuclear magnetic resonance imaging (MRI) apparatus.

2. Description of the Related Art

Magnetic field generation means include a super-conducting magnet (SCM), a resistive magnet (RM), a permanent magnet (PM) and their hybrid magnet systems. These magnet systems generate magnetic fields inside a magnetic field generation space in accordance with their intended applications, but the magnetic flux leaks outside the required space depending on the intensity of the magnetic fields generated and the shape and size of each magnet system. This leakage magnetic field exerts an adverse influence on other instruments and appliances (e.g. electron beam application appliances such as color television, X-CT, magnetic tape application appliances, etc), people bearing a pace maker, a magnetic card, and so forth. A typical example of the adverse influences can be observed in a magnet used for a nuclear magnetic resonance imaging (MRI) apparatus. Recently, the field intensity has been increased in MRI apparatus to improve sensitivity, and a magnetic field as high as from 0.5 to 2.0 T (Tesla) has been employed. Particularly, the number of MRI apparatuses using 1.5 T has increased. In the MRI magnet 1 shown in FIG. 1, a human body 14, an NMR signal detection coil 13, a gradient magnetic field coil system 7 and a system 9 for improving a field homogeneity are accommodated in a magnetic field generation space 16. Therefore, this room temperature magnetic field generation space 16 has a large diameter of 800 to 1,000 mm. To generate a high magnetic field, the magnet becomes inevitably a superconducting magnetic system. In FIG. 1, a cylindrical superconducting magnet (SCM) is shown split longitudinally, and its internal structure is shown. A magnetic field Ho in a Z direction is generated in the internal cylindrical magnetic field space 16 by causing a permanent current Ip to flow through the superconducting coil group 1. To detect nuclear magnetic resonance (NMR) signals with a high sensitivity, the magnetic field Ho must be homogeneous over a wide range. Therefore, the superconducting coil group 1 is so designed as to attain ±5 ppm/40 cm dsv (diameter spherical volume), for example, and is finely adjusted by the shim system 9. The superconducting coil group 1 is positioned in a vessel 2 filled with liquid He, and this vessel 2 is encompassed by aluminum cylinders 3 and 4 kept at temperatures of 80 K. and 20 K., respectively, in order to reduce evaporation of liquid He. The cylinders 3 and 4 can be kept at the low temperatures by means of contact with a refrigerator 10. The inside of the magnet is kept at a vacuum in the order of $10^{-6}$ Torrs to reduce evaporation of liquid He.

In FIG. 1, reference numeral 5 denotes a magnet outer cylinder, 6 is a inner cylindrical bore, 11 is an 80 K. contact, 12 is a 20 K. contact, and 15 is a patient table.

FIG. 2 shows a closed loop which is formed when the lines of magnetic force of the cylindrical magnetic space 16 of the cylindrical superconducting magnet 17 described with reference to FIG. 1 leave one of the apertures of the space 16, pass through a loop in an external space as shown in the drawing, and then return to the other aperture of the space 16.

It can be understood from FIG. 2 that if the magnetic shield does not exist, a wide range is magnetically contaminated. When the diameter of the apertures of the magnet 17 is about 1.0 m and the field intensity inside the space 16 is 1.5 T (Tesla), for example, the contour line of the magnetic field 5 mT (5 Gauss), which is said to be a safe line for people bearing a pace maker, is shown in FIG. 3.

In other words, the surface of a Z axis ellipsoid of revolution which is ±12 to 13 m in the Z direction in the magnetic field generating direction of the magnet 17 and ±9 to 10 m in Y (vertical) and X (horizontal) directions is the contour line 20 of 5 mT. If the magnetic field generator is used without magnetic shielding, therefore, an extremely wide range must be kept off-limits, and various magnetosensitive appliances, as described above, cannot be used.

Therefore, a magnetic shield must be utilized.

Conventionally, the following magnetic shields have been employed.

PRIOR ART EXAMPLE 1

The entire surface of the floor, ceiling and walls of the room, in which the superconducting magnet for the MRI apparatus is installed, is magnetically shielded by covering the entire surface with a few centimeters of iron sheets in order to prevent the leakage of the magnetic field to neighboring rooms, with an MRI apparatus which is not self-shielded magnetically, as shown typically in FIG. 1. This shield system was used before the self magnetic shield type superconducting magnet was developed. This shield system requires enormous expenses and a large number of man-hours, and is not free from the problem of noise, and the like.

PRIOR ART EXAMPLE 2

FIG. 4 shows an example of a self-shield type MRI superconducting magnet equipped with an iron magnetic shield material 19 as a magnetic material. The magnet 17 has the same structure and is cylindrical in the same way as the magnet shown in FIG. 1, and only the portions necessary for explanation are hereby illustrated. The iron self-shield type can be produced with a superconducting coil 1 having substantially the same volume as that of the magnet shown in FIG. 1, and accordingly the liquid He vessel 2 is small compared with other shielding types. Since evaporation of liquid He is less and the magnet 17 can be made compact, the system can be brought into the installation room through a double-leaf door (the iron shield 19 is assembled after the magnet is carried in) and is unexpensive. Besides these features, this design can solve almost all the problems experienced with the Prior Art Example 1, but the problem of the weight of the iron shield material 19 is presented.

In other words, the total weight is 6 to 7 tons inclusive of the iron shield material 19 at the field intensity of 0.5 T, but when the field intensity is 1.5 T, 30 tons or more of the iron shield material 19 alone is necessary to attain a Gauss line of ±4.5 m in the Z direction and ±2.5 m in the radial direction (R) of the magnet. Therefore, since a concentrated load is applied to the floor, reinforcement of the floor is necessary.

PRIOR ART EXAMPLE 3

FIG. 5 shows an example of an active shield type superconducting magnet (AS-SCM) 22 for an MR imaging apparatus equipped with a static field cancelling superconducting coil (AS-SC) 21. This structure is obtained by adding the AS-SC 21 to the superconducting magnet shown in FIG. 1.

Since iron shield material is not used and the weight is small, the aforementioned 5-Gauss line (Prior Art Example 2) might be made smaller than in the Prior Art Example 2. In the case of a 1.5 T magnet, the weight is 11 tons when the aperture diameter of the magnetic field space 16 is about 1 m. On the other hand, there are a large number of drawbacks. About three-times as many expensive superconducting wires are necessary as compared with the superconducting magnet shown in FIGS. 1 and 4, and the magnet becomes extremely expensive. Since the liquid He vessel 2 is large, the evaporation quantity of liquid He per unit time is at least twice as great as in the case of the magnet described above. The magnet 22 cannot be moved into the installation room through its double-leaf door, and so the entrance must be expanded. Even the places at which the magnetic field is apparently close to zero are likely to be disturbed magnetically by movement of heavy devices such as automobiles, elevators, etc. Since the superconducting coils 1 and 21 are close to each other, extremely large attraction force and repulsive force act on the coils, and the structure is unstable. Since the AS-SCM 22 is weak against shock, the transportation cost becomes high, as it must be heavily protected against shock.

PRIOR ART EXAMPLE 4

FIG. 6 shows an example of a so-called "hybrid" type superconducting magnet, wherein the AS-SCM structure 22 shown in FIG. 5 is covered cylindrically with iron shield material 19.

This is a combination of the iron shield type of Prior Art Example 2 with the active shield type of Prior Art Example 3, as can be readily understood from their respective drawings.

The drawback with the iron self-shield type superconducting magnet in that a large amount of the shield iron material is necessary can be solved by reducing the amount by supplementing to certain extents the magnetic shield by the AS-SC 21.

From the aspect of the AS-SCM, on the other hand, various drawbacks described above are mitigated, but the diameter ratio between the main coil 1 and the cancelling coil 21 remains unaltered as in the case of the AS-SCM, as can be clearly seen from FIG. 6. Therefore, the liquid He tank remains unaltered and hence, the size of the magnet (exclusive of the iron shield 19) is hardly reduced. Accordingly, the problem of bringing the apparatus into the room at the time of installation remains unaltered, as in the case of the AS-SCM.

As is obvious from the foregoing explanation, the Prior Art Examples 1 to 4 involve the following drawbacks, respectively.

Prior Art Example 1

Enormous expenses and a large number of man-hours are necessary for the work, and noise is generated.

Prior Art Example 2

The magnet is very heavy and the floor must be reinforced.

Prior Art Example 3

Large quantities of superconducting wires are necessary, and the SCM size is great. In addition to the large evaporation quantity of liquid, He, door enlargement work is necessary for bringing the magnet into the installation room. This system is expensive and is structurally unstable, and its transportation cost is high.

Prior Art Example 4

It has the same problem as that of Prior Art Example 3, though the problem of the Prior Art Example 3 can be mitigated to some extent.

SUMMARY OF THE INVENTION

It is an object of the present invention to provide a magnetic field generating system capable of reducing the weight and having excellent magnetic shield performance.

It is another object of the present invention to provide a magnetic field generating, system which can be easily brought into a room for installation.

According to the present invention, there is provided a magnetic field generating system comprising means for generating a static magnetic field in a predetermined direction inside a predetermined space, means for generating magnetic fields for cancelling a leakage magnetic field from the static magnetic field generation means, and a magnetic shield made of a magnetic substance and disposed between both of these means, wherein the cancelling magnetic field generation means are of a cryostatless type.

The static magnetic field generation means generates a static magnetic field in a predetermined direction inside a predetermined space, and the cancelling magnetic field generation means generates magnetic fields for cancelling leakage magnetic field from the static magnetic field generation means. The magnetic shield made of a magnetic substance so operates as to shield leakage from the static magnetic field generation means. According to the present invention, therefore, the following advantages can be obtained.

(1) Almost all the magnetic fluxes from the static magnetic field generation means remain within the magnetic shield, and the leakage quantity of the magnetic fluxes to the outside becomes small. Therefore, a magnetomotive force necessary for the magnetic field generation means for generating the cancelling magnetic fields need be only small. In the case of a superconducting magnet having an aperture diameter of 1 m and a field intensity of 1.5 T, for example, the magnetomotive force of the cancelling magnetic field generation means may be approximately in the range of from 1/70 to 1/30 of that of the active shield type in order to set the 5-Gauss line to ±4.5 m in the direction of the magnetic field and ±2.5 m in the direction orthogonal to the former, even when iron is used as the magnetic shield and its amount size is about the half (about 15 tons) of that of the self-shield type. Speaking conversely, the weight of the magnetic shield is only about the half that of the self-shield type eve when the magnetomotive force of the cancelling magnetic field is approximately in a range of from 1/70 to 1/30 of that of the active shield type. It can be understood, therefore, that the present invention is very suitable for reduction of the weight of the magnet.

(2) The cancelling magnetic field generation means are of the cryostatless type and are positioned on the opposite side of the static magnetic field generation means relative to the magnetic shield. Therefore, even when the static magnetic field generation means is a superconducting magnet cooled by liquid He, the vessel for this liquid helium can be made compact, and transportation of the magnet into the installation room can be achieved without expanding the door. This transportation can be carried out separately for the magnetic shield and the cancelling magnetic field generation means. Needless to say, the size and weight of the magnetic shield can be reduced due to the existence of the cancelling magnetic field generation means, and since the cancelling magnetic field generation means are of the cryostatless type, in addition to the existence of the magnetic shield, the size and weight of the cancelling magnetic field generation means can be reduced. Accordingly, the transportation, of the magnet into the installation room can be achieved without the need of expanding the door. In other words, it ca be understood that the magnetic field generating system according to the present invention makes its transportation into the installation room easy.

Since the liquid helium (He) vessel is small in this case, its evaporation quantity is naturally small.

(3) As described in paragraph (1) above, the magnetomotive force of the cancelling magnetic field generation means, for generating the cancelling magnetic fields, may be small. The cancelling magnetic field generation means are disposed outside the magnetic shield. Accordingly, the leakage from the cancelling magnetic field generation means into the predetermined space is very limited, and so an increase in the magnetomotive force of the static magnetic field generation means is not required.

(4) If the self magnetic shield does not exist, large-scale magnetic shielding of the floor, ceiling and side walls of the room is necessary, but the present invention does not require such.

(5) The field intensity of mutually opposite polarities is lower than in the conventional active shield type, at places where the field intensity is apparently substantially zero due to the operation of the cancelling magnetic field generation means. Therefore, even when heavy matter such as an automobile or an elevator moves near such places, their magnetic disturbance to the predetermined space is small.

(6) Homogeneity of the magnetic field inside the predetermined space is extremely important. In the present invention, the cancelling magnetic field generation means are disposed on the opposite side of, and independently of, the static magnetic field generation means, with reference to the magnetic shield. Accordingly, their positions can be adjusted easily in order to adjust the homogeneity of the magnetic field.

(7) If the cancelling magnetic field generation means are of a cryostat type, a refrigerator is practically necessary in addition to the cryostat. Accordingly, the cost becomes higher, and at the same time, the size and weight become greater, so that the transportation and assembly into and inside the installation room become more difficult. Another problem is that the position of the patient is higher, so that the patient's fear increases. In contrast, the cancelling magnetic field generation means in the present invention are of the cryostatless type, and no such problems develop.

The above and other objects and novel features of the present invention will become more apparent from the following detailed description when taken in conjunction with the accompanying drawings.

BRIEF DESCRIPTION DRAWINGS

DESCRIPTION OF THE PREFERRED EMBODIMENTS

Figure 4:
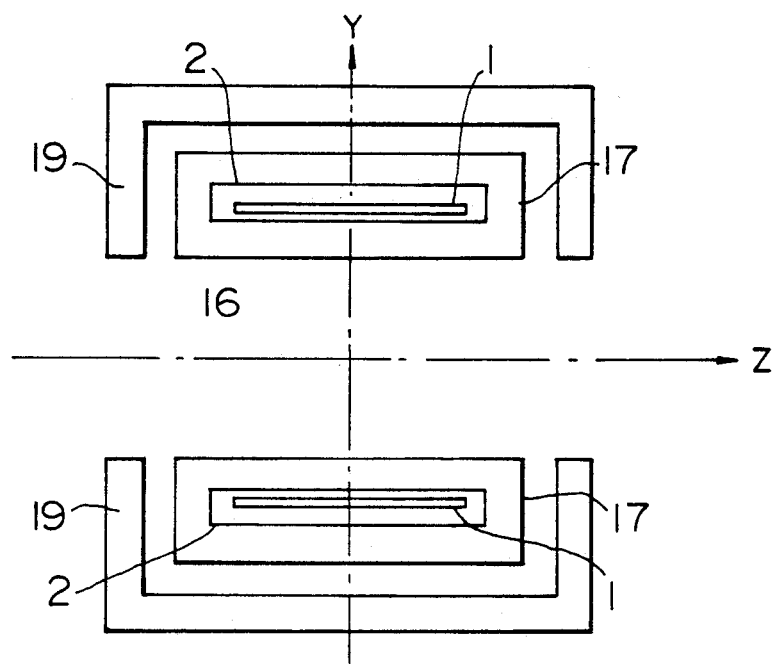
FIG. 4 is a schematic longitudinal sectional view of another of an ordinary magnetic field generating system.
Figure 5:
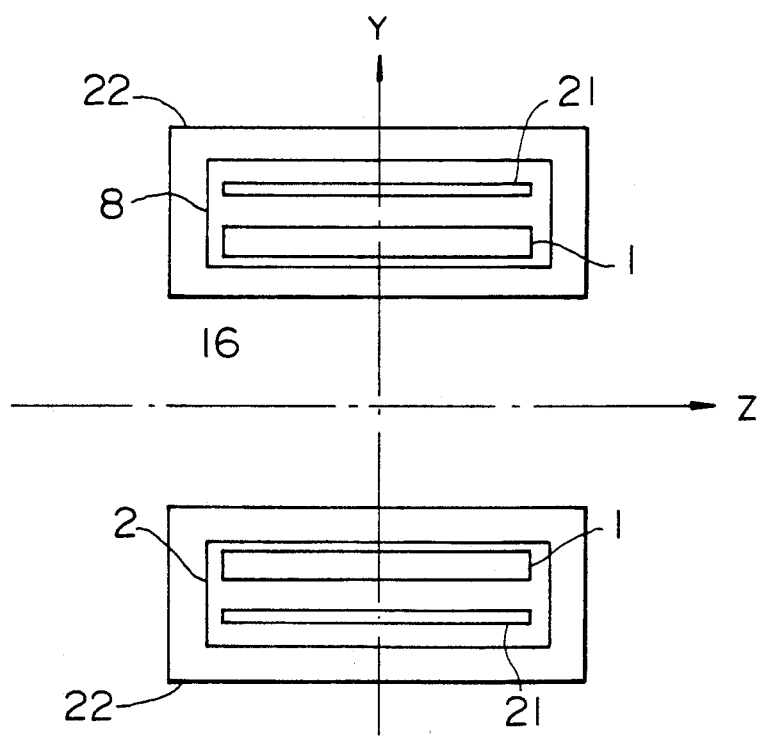
FIG. 5 is a schematic longitudinal sectional view of still another example of an ordinary magnetic field generating system.
Figure 6:
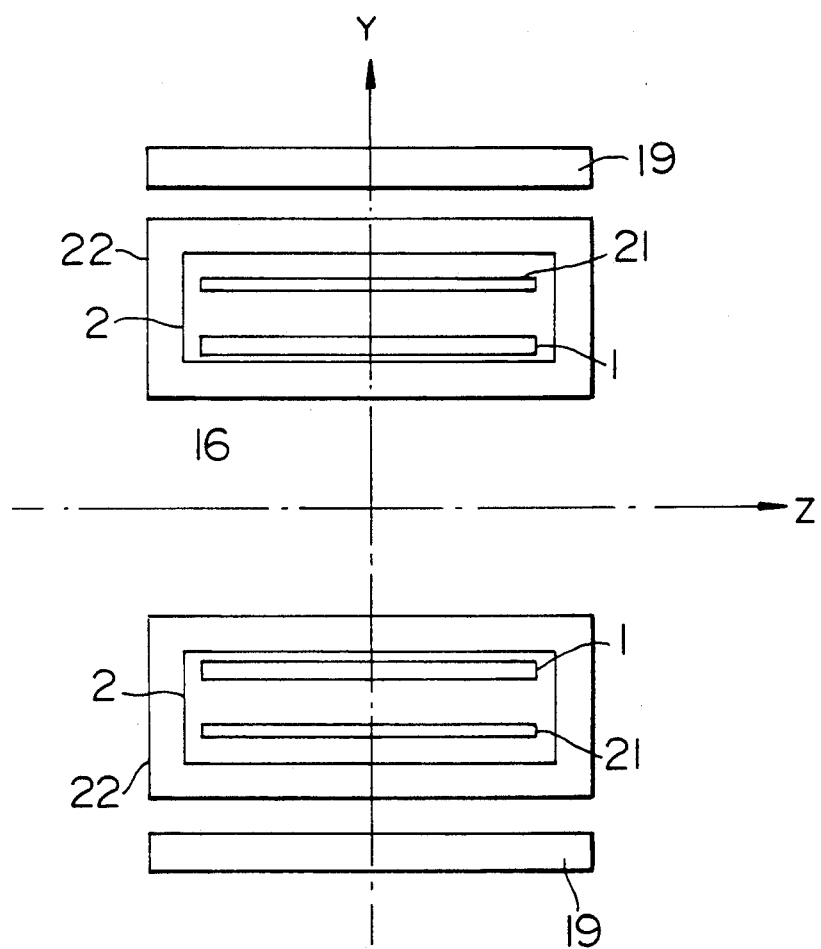
FIG. 6 is a schematic longitudinal sectional view of still another example of an ordinary magnetic field generating system.
Figure 7:
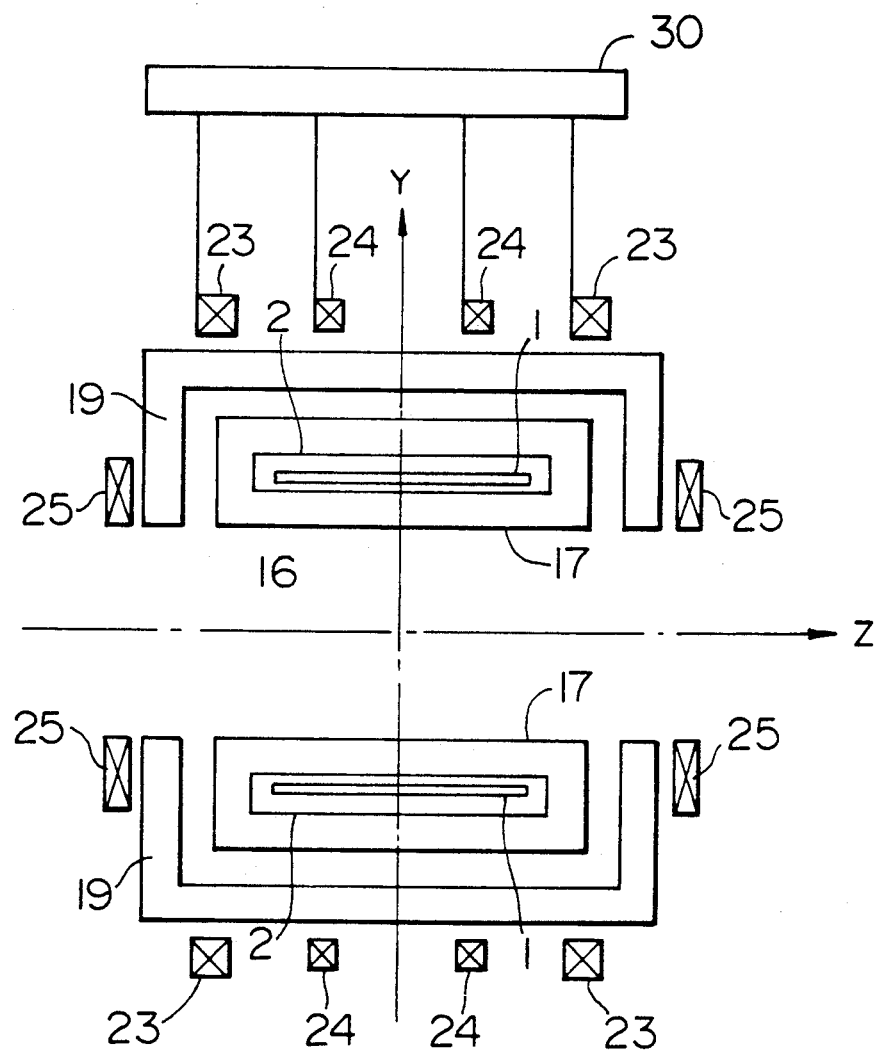
FIG. 7 is a schematic longitudinal sectional view of a magnetic field generating system according an embodiment of the present invention.

FIG. 7 shows a preferred embodiment of the present invention. A superconducting magnet 17 is cylindrical in the same way as the superconducting magnet 17 shown in FIG. 4, and its internal structure is also the same.

In the self-shield type of the Prior Art Example 1, the self-shield is 30 tons or more when the aperture diameter of the magnetic field space is about 1 m and the field intensity is 1.5 T, but the self-shield of a ferromagnetic material as typified by iron in this embodiment reduces the value to half or below. In this embodiment, the design of the magnetic circuit (design by computer simulation) is made so as to provide high homogeneity ($\pm 5$ ppm/40 cm dsv (diameter spherical volume)) in the magnetic field space 16 inclusive of those magnetic fields which are generated by the addition of the whole or part of resistive coil groups 23, 24 and 25 that will be described in detail elsewhere. Therefore, the main difference of this embodiment from the iron self-shield type shown in FIG. 4 from the aspect of the superconducting coil 1 is merely the shape and disposition of the coil, and there is hardly any increase in the amount of expensive superconducting coil material. This is considerably different from the AS-SCM and hybrid types of the Prior Art Examples 3 and 4. Since the magnet 17 is from 5 to 7 tons, the magnet system according to the present invention can be 15 to 20 tons as a whole, which is substantially the same as the hybrid type of the Prior Art Example 4.

The resistive coil groups 23, 24 and 25 that are additionally disposed in the proximity of the magnetic shield 19 made of the magnetic substance will be explained. All the resistive coil groups 23, 24 and 25, that are disposed symmetrically with respect to the Y axis of the magnet, are ring-like, and the coils forming a pair are all the same. The coil material is a copper wire, but it may be an aluminum wire. These wires may be web-like or belt-like. A variable D.C. power supply 30 supplies currents to these coils so that when the line of magnetic force generated by the main coil 1 flows in the direction $+Z$ shown in FIG. 7, these coil groups 23, 24, 25 generate lines of magnetic force in the $-Z$ direction, respectively. It is hereby to be noted that in the AS-SCM and hybrid types of the Prior Art Examples 3 and 4, the cancelling coil 21 exists close to the main coil 1, so that the magnetic field is remarkably lowered in the necessary magnetic field space 16. To supplement this drop, the amount of the main coil 1 is further increased. In this embodiment, on the other hand, almost all the lines of magnetic force generated by the main coil 1 flow through the magnetic circuit of the magnetic shield 19. For this reason, the lines of magnetic force leaking to outside are small.

Only these small leakage components need to be cancel, and the sum of the magnetomotive force (current $\times$ number of turns) required for the coil groups 23, 24, 25 is approximately in a range from 1/70 to 1/30 the cancelling coil of the AS-SCM type. In the MRI magnet, therefore, the magnetomotive force needs be some dozens of thousands of ampere-turns (AT). When the amount of the magnetic shield 19 is decreased as described above, the magnetic flux density of the ferromagnetic material increases, its permeability decreases, and the leakage component to the outside of the magnet increases. Consequently, the cancelling load on the resistive coils increases. In other words, the balance between the size, of the magnetic shield 19 and the magnetomotive force by the resistive cancelling coil groups 23, 24, 25 must be taken into account. Unlike the AS-SCM and hybrid type, the drop of the magnetic field intensity by the cancelling coils in the necessary magnetic field space 16 is in order of 0.001 T in the main coil 1 need not be increased. On the other hand, a field homogeneity of about $\pm 5$ ppm/40 cm dsv is necessary for the MRI magnet inside the necessary magnetic field 16; hence, the design of the magnetic circuit inclusive of the normal conductive cancel coil groups 23, 24, 25 is necessary. In other words, when the computer simulation is carried out, it is necessary i) to correctly cancel the leakage field distribution, and ii) to keep the field homogeneity distribution in the space 16 at a high level.

More often than not, products are somehow different from the design. To accomplish the optimum state, current adjustment for each of the cancelling coil groups is made possible, and position adjustment is also made possible in each of the X, Y and Z directions. Though this embodiment uses three kinds of resistive cancelling coils 23, 24 and 25, the coils may be one or two kinds, or more than three kinds. The current flowing through each coil can be adjusted by the variable current power supply 30. The position adjustment of each coil can be carried out in a customary manner (e.g. JP-A-61-258151, JP-A-62-221340 and JP-A-60-108044).

When the total number of turns of the cancelling coil groups is 6,000 turns and the D.C. current supplied is 10 A (ampere) (provided that the current is supplied substantially uniformly to each coil), the magnetomotive force is $6 \times 10^4$ AT in total. The embodiment illustrates the case of six coil groups, and the diameter of the copper wire of the coil can be selected so that each coil has a resistance value of about 10 $\Omega$ (ohms). Consumed power P at this time is given as follows:

$$P = (10\ A)^2 \times 10 \Omega \times 6\ pcs. = 6\ KW\ (kilo\text{-}watts).$$

The resistance value can be reduced to about half by increasing the wire diameter of the coil to reduce its resistance value. As a result of this, P is 3 KW. Furthermore, the number of coils can be reduced to 2 to 4, and in this case, P is 1 to 2 KW.

Although the above may seem a defect which is not observed in other magnet systems, the operation cost is lower in the present system, which can reduce the consumed amount of liquid He to half or less as compared with the AS-SCM and hybrid types in which the evaporation of liquid He is great.

Figure 1:
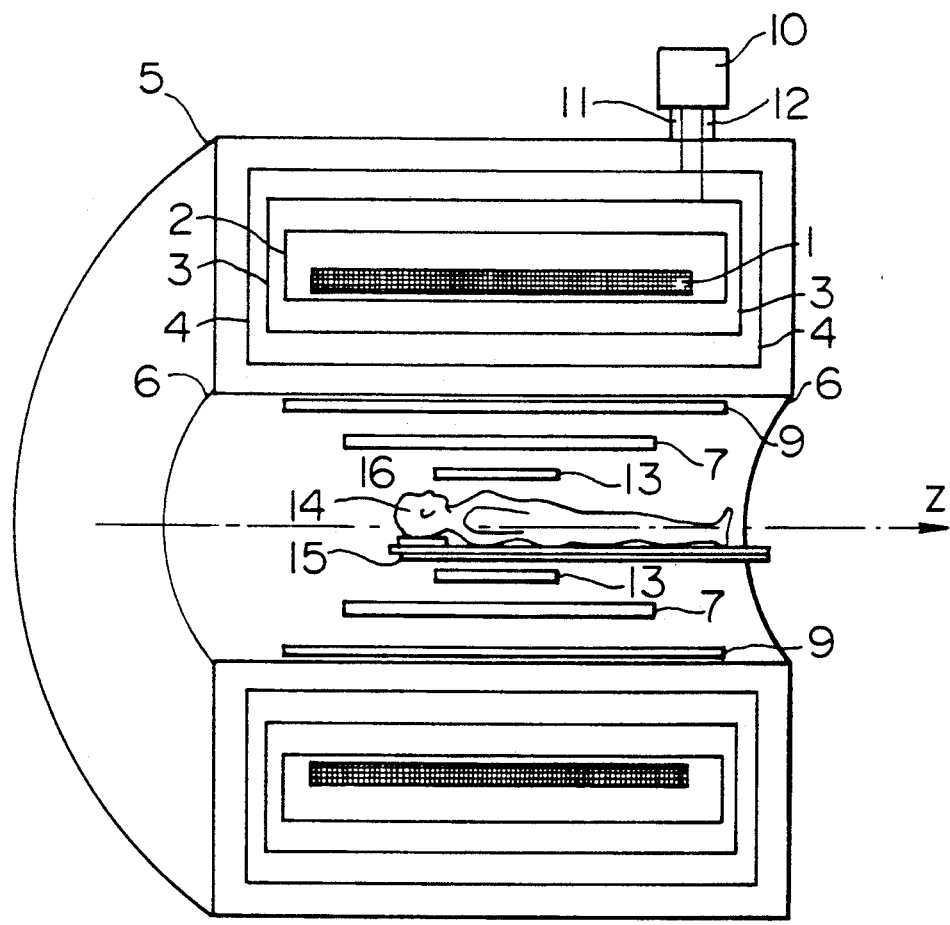
FIG. 1 is a longitudinal sectional view of an example of an ordinary magnetic field generating system.
Figure 2:
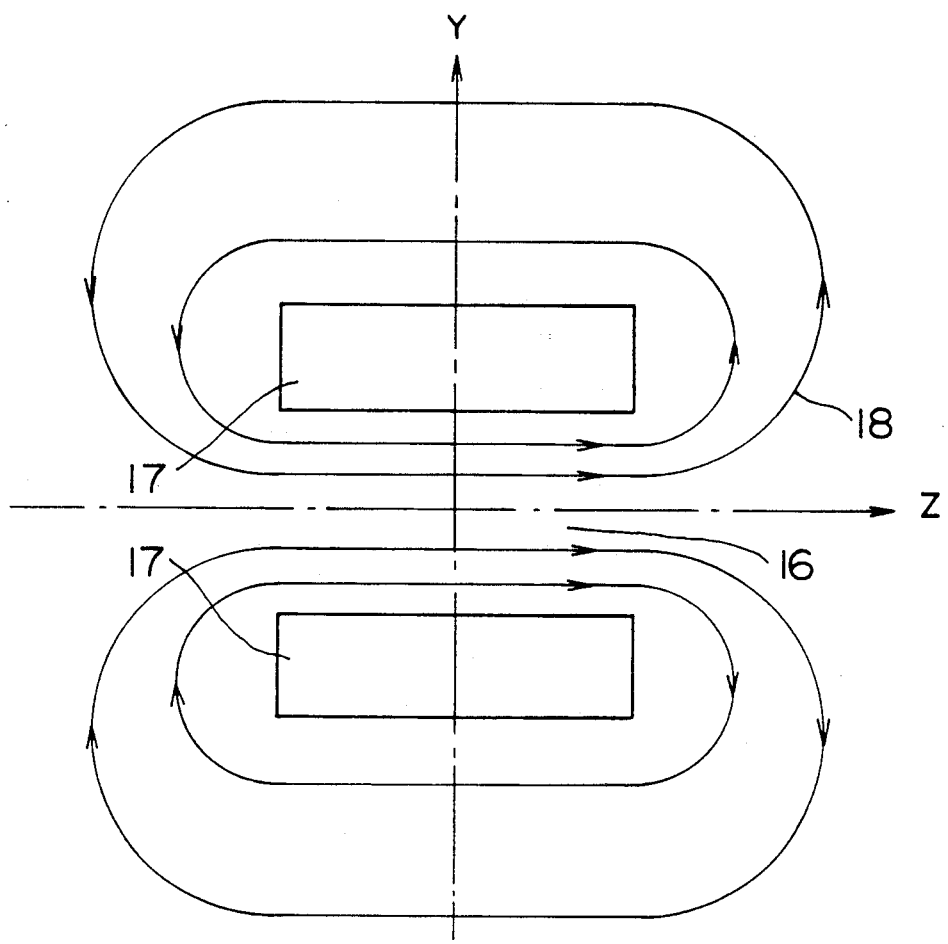
FIG. 2 is a diagram showing a distribution of lines of magnet force generated from a magnet.

As can be seen from FIG. 1, the MRI magnet has a large size so as to accommodate a human body therein. On the other hand, a routine MRI apparatus is disposed in many cases in an existing room through an existing door. The door is a double-leaf door in many cases and has a width of 1.8 m, and a height of 1.8 m. Since the MRI apparatus is likely to be adjacent sickrooms, expansion of the door by destroying a ferro-concrete wall must be avoided by all means to prevent any large noise. This is one of the very important requirements for MRI magnets. Reduction of the size is impossible in the case of the AS-SCM and hybrid types, and these types cannot satisfy the requirement described above.

In the magnet system of this embodiment, only the portion indicated by reference numeral 17 in FIG. 7 is carried into the room. This system can satisfy the requirement described above. After the portion 17 is carried in, the magnetic shield 19 and the cancelling coil groups are mounted.

The weight of the magnetic shield 19 must be reduced as much as possible. An SS-41 iron material having a high carbon content is mostly used ordinarily as the ferromagnetic material, but in order to reduce the weight, soft iron or an iron alloy containing Co (cobalt) is used appropriately for places where the flux density increases. In this way, the weight of the magnetic shield 19 can be reduced by 10 to 20% without increasing the leakage of flux component outside the magnetic circuit of the magnetic system.

Conventional iron self-shield types did not much consider the shape itself of the magnetic shield 19. The shape of the magnetic shield 19 is optimized throughout its positions by calculating the flux density at all the positions by computer simulation so as to accomplish a so-called "constant B (flux density) magnetic circuit" in which the flux density is constant throughout all the positions. Alternatively, design is made by the use of an electromagnetic soft iron or an iron alloy containing cobalt (Co) as described above for the positions at which the flux density increases, so that the permeability is constant at all the positions of the magnetic shield 19. These methods can reduce the leakage flux component outside the magnet even when the magnetic shield 19 is limited to a predetermined weight. The leakage flux component can also be reduced with a constant weight by constituting the magnetic shield 19 into a double- or multiple-layered structure.

As described above, the load on the cancelling coil groups 23, 24, 25 can be reduced by optimizing the magnetic shield 19, and the sizes of the coils and excitation power supply 30 can be reduced.

It is further possible to use a ferrite material or a permanent magnetic material such as an Nd-Fe-B system material for a part of the cancelling coil groups.

The superconducting magnet portion 17 shown in FIG. 7 can be applied as the resistive magnet or the permanent magnet. The coil groups 23, 24 and 25 may be connected either in series or in parallel.

Figure 8:
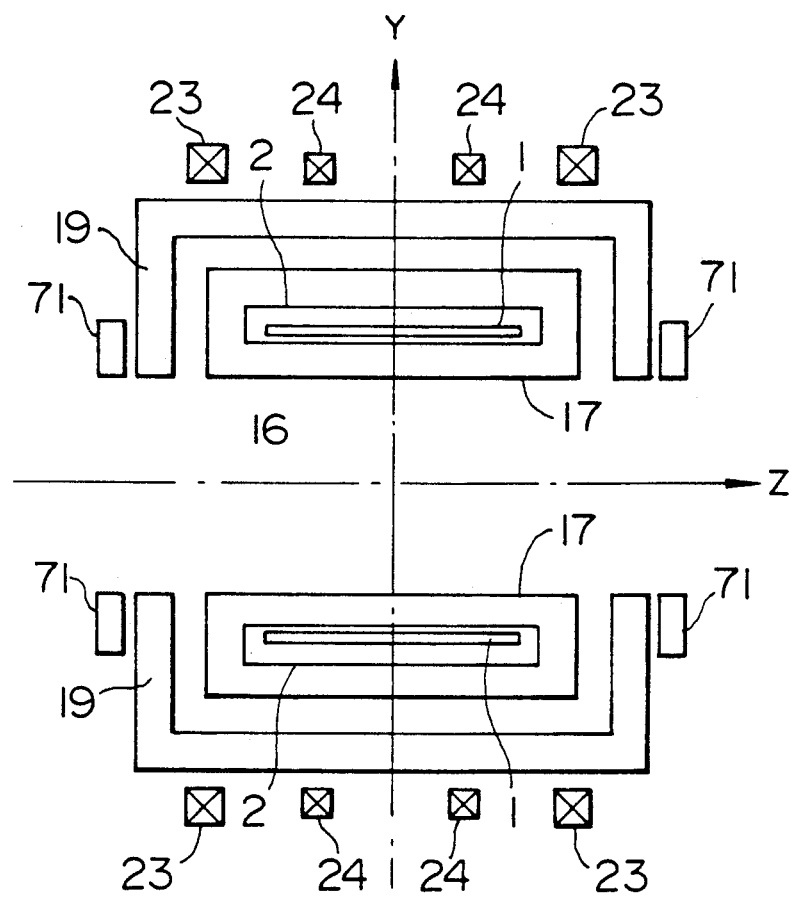
FIG. 8 is a schematic longitudinal sectional view of a magnetic field generating system according to another embodiment of the present invention.

FIG. 8 shows an embodiment wherein the resistive coil 25 shown in FIG. 7 is replaced by permanent magnets 71. These magnets play an auxiliary role for the resistive coil groups 23, 24. The coil groups and the permanent magnets together cancel the leakage magnetic field of the superconducting magnet (SCM) 17. The leakage magnetic field can be cancelled even in the absence of the coil 25 or the magnets 71, but if they exist, the adjustment of the leakage magnetic field cancelling effect, and/or the adjustment of the field homogeneity in the magnetic field generation space 16, and/or the effect of the adjustment of the field intensity can be obtained by changing the excitation current in the coil 25 and increasing or decreasing the volume of the permanent magnet material in the magnets 71 (the magnets 71 are assembled of small permanent parts). The magnet 71 may be disposed either in direct contact with the magnetic shield 19 or through a non-magnetic material.

Figure 3:
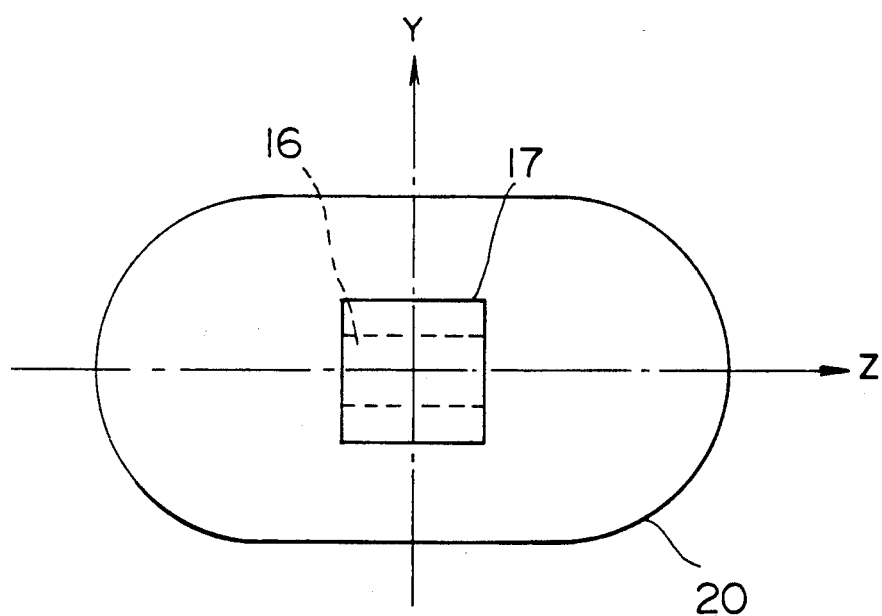
FIG. 3 is a contour line diagram of a leakage magnetic field.
Figure 9:
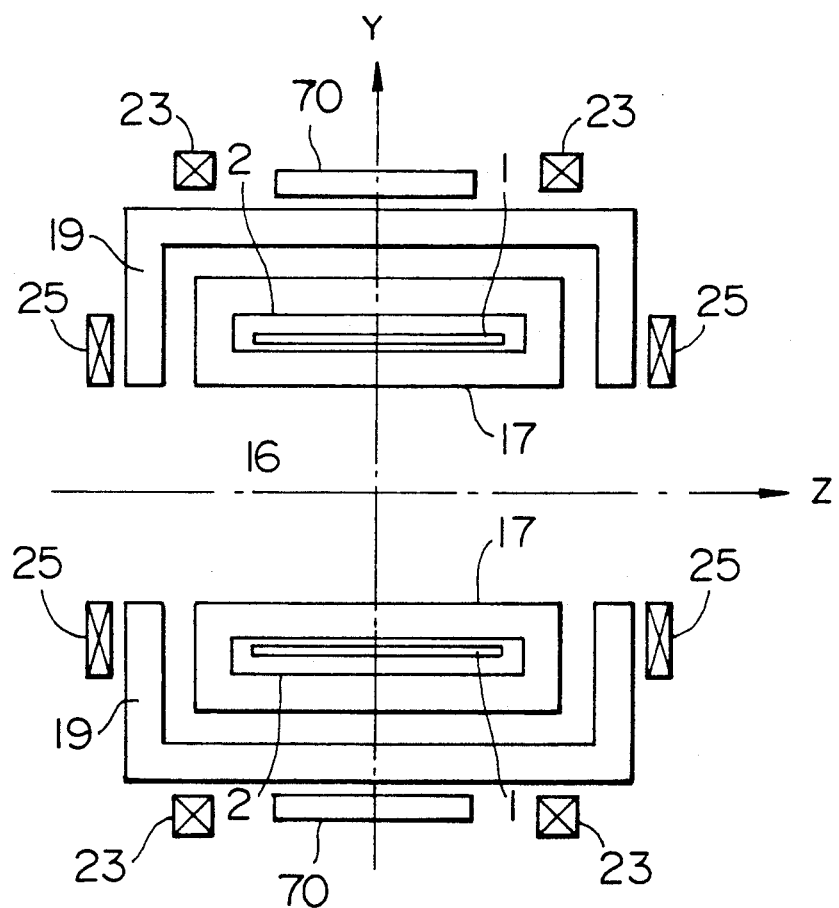
FIG. 9 is a schematic longitudinal sectional view of a magnetic field generating system according to still another of the present invention.

FIG. 9 shows another embodiment wherein the resistive coil 24 shown in FIG. 7 is replaced by the permanent magnet 70. The permanent magnet 70 need not always be integral, but a plurality of blocks having a suitable size may be magnetized in a predetermined necessary direction and may be used after integration. When the superconducting magnet system shown in FIG. 3 is installed in situ, there are many cases where the magnet system cannot be carried in because the door of the room is too narrow. In such case, the magnet 17 and the magnetic shield 19 are carried in separately and are assembled in situ, but it is very difficult to assemble the coil 24 shown in FIG. 1. On the other hand, the magnet 70 shown in FIG. 9 is produced by integrating the blocks described above and has therefore the advantage that it can be assembled easily. The magnet 70 is formed into a unitary structure which is symmetrical with respect to the Y axis, but it may be assembled from a plurality of divided integrated members so long as they are symmetrical with respect to the Y axis. The magnet 70 may be in direct contact with the magnetic shield 19 or may be disposed through a non-magnetic material.

Figure 10:
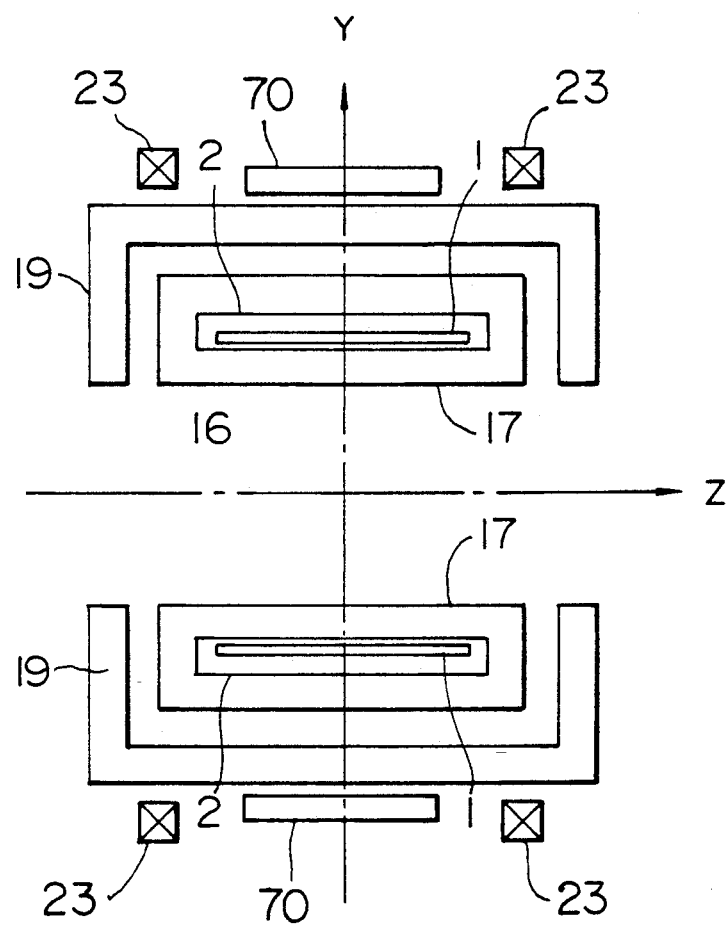
FIG. 10 is a schematic longitudinal sectional view of a magnetic field generating system according to yet another embodiment of the present invention.

As has been explained with reference to FIG. 8, the coil 25 may be replaced by the permanent magnet material 71, or they need not exist, as depicted in FIG. 10.

Figure 11:
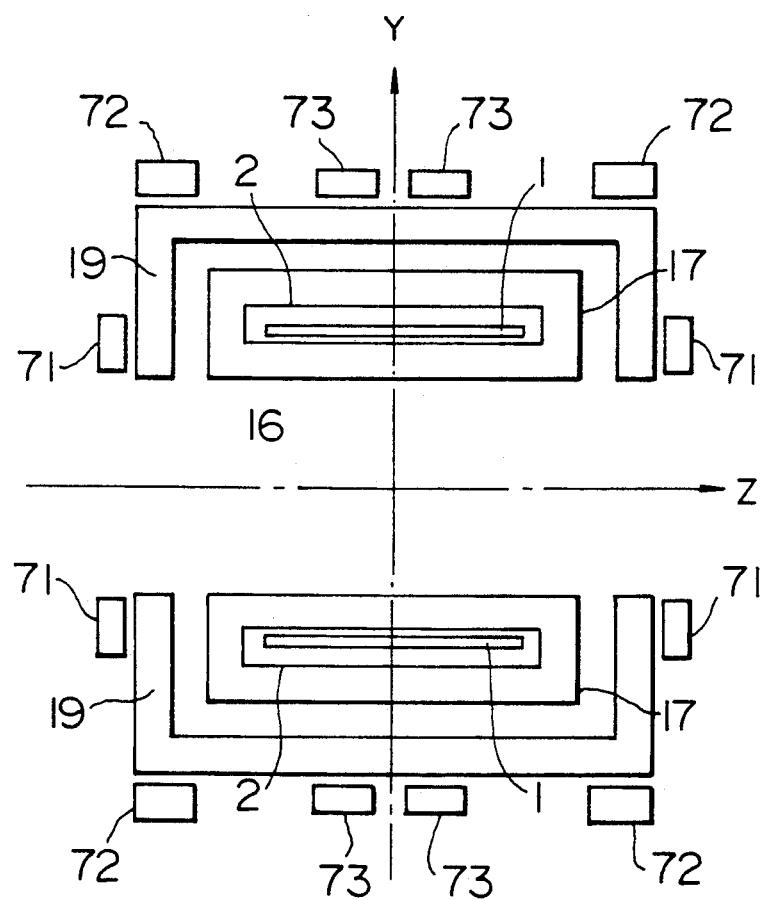
FIG. 11 is a schematic longitudinal sectional view of a magnetic field generating system according to a further embodiment of the present invention.
Figure 12:
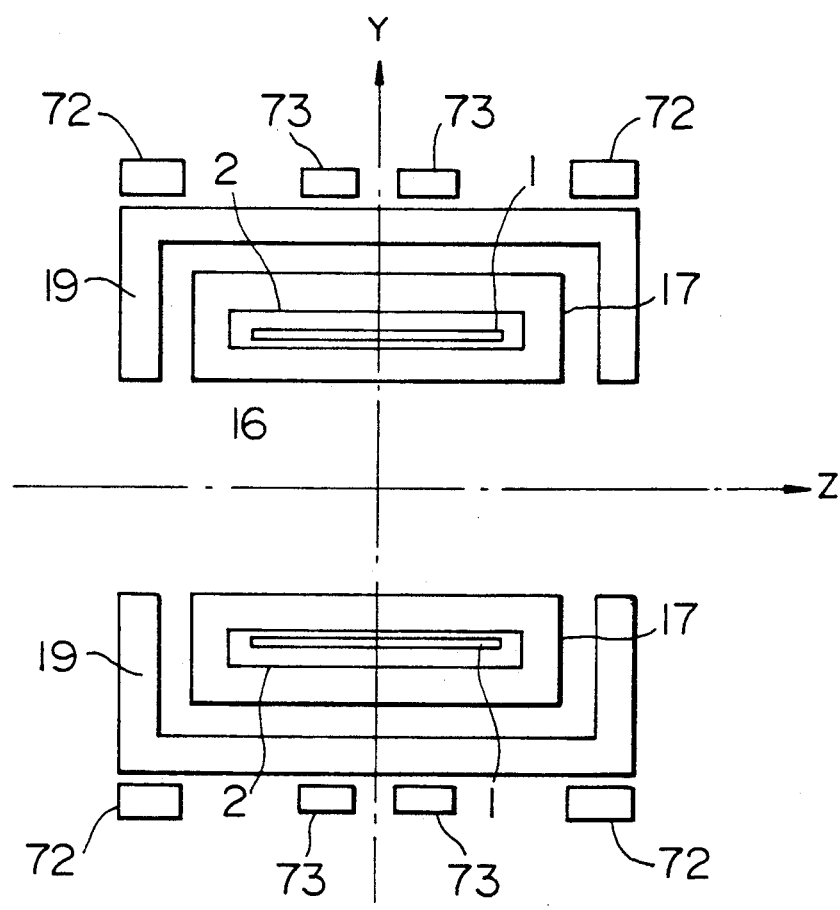
FIG. 12 is a schematic longitudinal sectional view of a magnetic field generating system according to a still further embodiment of the present invention.

FIG. 11 shows still another embodiment wherein all the resistive coil groups 23, 24 and 25 are replaced by the permanent magnets 71, 72 and 73, respectively. FIG. 12 shows another embodiment wherein the permanent magnet 71 is omitted. These embodiments have the advantage that the excitation power supply 30, necessary for the resistive coils, is no longer necessary because the leakage magnetic field from the magnet 17 is cancelled by only the permanent magnets.

Figure 13:
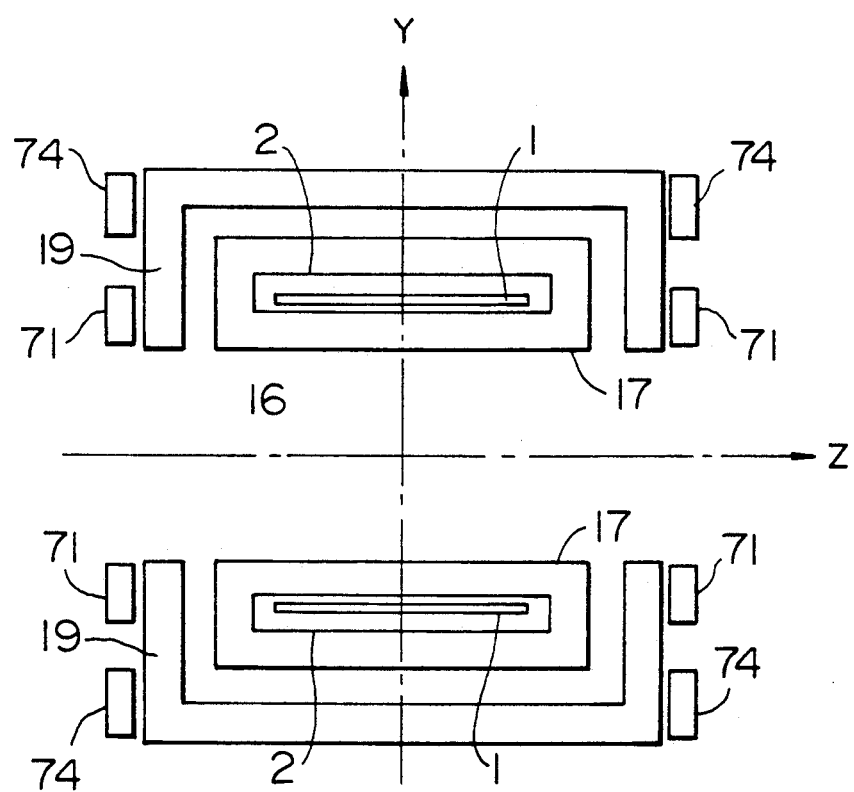
FIG. 13 is a schematic longitudinal sectional view of a magnetic field generating system according to of yet further embodiment of the present invention.

The permanent magnet 72 may be disposed in direct contact with the magnetic shield or through a non-magnetic material, in the same way as the permanent magnet 71. Permanent magnets 73 represent an example of the division of the permanent magnet 70 shown in FIG. 10. It is further possible to delete the permanent magnets 72 and 73 by increasing the size of the permanent magnet 71 or by disposing a large ring-like permanent magnet 74 around the outer periphery of the permanent magnet 71. In this way, the assembly work becomes easier (FIG. 13).

The position adjustment and the current adjustment of the resistive coil groups shown in FIGS. 8 to 12 can be made in the same way as in FIG. 7. Similarly, the position adjustment as well as the adjustment of increasing or decreasing the permanent magnet material are effected in the permanent magnet group, too, in order to obtain the same effect as described above. The resistive coil 25 does not always generate a magnetic field in the direction opposite to the field generating direction of the magnet 17. There can be a case in which it generates a magnetic field in the same way as the magnetic field of the magnet 17 for the adjustment of the system as a whole. This also holds true of the permanent magnet material 71.

All of FIGS. 7 to 13 have symmetry of rotation with respect to the Z axis. All of the resistive coil groups 23, 24, 25 and the permanent magnet groups 70, 71, 72, 73, 74 are ring-like.

However, the permanent magnets need not be continuous but may be interrupted (such as 8-split or 4-split).

Figure 14:
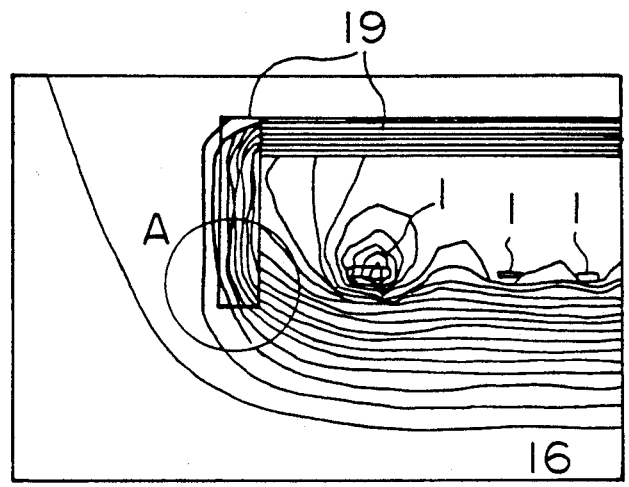
FIG. 14 is a schematic view showing the flow of a magnetic flux inside a magnetic shield made of a magnetic substance.

FIG. 14 shows an example of the result of computer simulation wherein the mode of distribution of the lines of magnetic force generated from the superconducting coil 1 in the iron self-shield type superconducting magnet is shown. It can be understood that almost all the resulting magnetic fluxes flow inside the iron self-shield 19. The field intensity at the central portion 19 is 1.5 T (Tesla).

Figure 15:
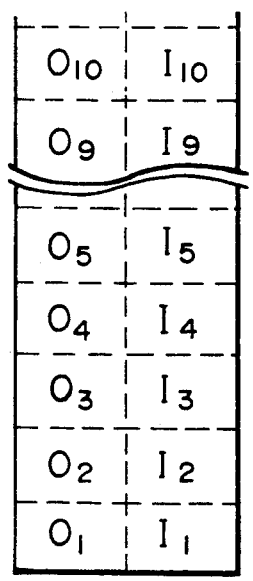
FIG. 15 is an enlarged view of a portion A in FIG. 14.

FIG. 15 is an enlarged view of the portion A of the magnetic shield 19. The portion is divided and the addresses are allocated for the purpose of simulation as shown in the drawing. The flux density B in the iron (SS-41) is different depending on the address as shown in Table 1, and it can be understood that a great difference exists in the specific permeability $\mu_r$ as a criteria of focussing of the magnetic flux into iron. This is obvious from Table 1.

TABLE 1

| | Flux density B (T) Specific permeability $\mu_r$ | | | | |
|---|---|---|---|---|---|
| $O_1$ | 1.26 | 2.15 | $I_1$ | | |
| | 923 | 21 | | | |
| $O_2$ | 1.68 | 1.97 | $I_2$ | | |
| | 207 | 61 | | | |
| $O_3$ | 1.91 | 2.03 | $I_3$ | | |
| | 73 | 45 | | | |
| $O_4$ | 2.03 | 2.07 | $I_4$ | | |
| | 45 | 35 | | | |
| $O_5$ | 2.08 | 2.09 | $I_5$ | | |
| | 33 | 30 | | | |
| $O_9$ | 1.52 | 1.81 | $I_9$ | | |
| | 403 | 110 | | | |
| $O_{10}$ | 1.03 | 1.47 | $I_{10}$ | | |
| | 1331 | 488 | | | |

Specific attention should be paid to the inside (I side) of the magnetic shield 19. Since it is the plane which the magnetic flux enters directly, it is likely to reach a high flux density. The magnetic shielding property can be improved if a pure iron material or a Fe-Co material having a high flux density and a high specific permeability $\mu_r$ is used for this portion. When the outer plane (O side) reaches a high flux density, it is economical to increase the thickness so as to lower the flux density and to attain a high specific permeability. However, the weight increases to some extent.

The numeric value at each address in Table 1 represents a mean value in each region, and the value changes smoothly in practice inside each region and between adjacent regions.

The embodiments of the present invention provide the following effects.

(1) The present invention provides a magnetic field generating system which is suitable for reducing the weight of the magnet.

(2) The present invention provides a magnetic field generator which can be moved easily into an installation room.

(3) The influences of the cancelling magnetic field on the magnetic field inside a predetermined space are small; hence, the magnetomotive force of the static magnetic field generation means need not be increased, in particular.

(4) Large-scale magnetic shielding of the floor, ceiling, side walls, etc, of the installation room is not necessary.

(5) Even when a heavy weight matter such as an elevator moves at the place where a cancelling magnetic field acts and the field intensity is apparently and substantially zero, the movement of such a matter hardly disturbs the magnetic field inside the necessary space.

(6) The position of the cancelling magnetic field generation means can be adjusted so as to adjust the field homogeneity.

(7) The magnetic field generating system of the present invention has excellent magnetic shielding characteristics.

(8) The evaporation quantity of liquid He is as small as in the iron self-shield type.

(9) The SCM main body is light in weight, is strong against shock, and is easy to transport.

While the present invention has been described in its preferred embodiments, it is to be understood that various changes and modifications can be made by those skilled in the art without departing from the spirit and scope of the invention.

We claim:

1. A magnetic field generating system comprising:
   means for generating a static magnetic field in a predetermined direction inside a predetermined space;
   a magnetic shield encircling said predetermined space to constrain the static magnetic field; and
   means for generating a cancelling magnetic field encircling said magnetic shield to cancel leakage magnetic field resulting from the static magnetic field escaping from said magnetic shield.

2. A magnetic field generating system according to claim 1, wherein said static magnetic field generation means is of a superconducting coil type.

3. A magnetic field generating system according to claim 1, wherein said static magnetic field generation means includes a superconducting coil assembly and a tank for storing said superconducting coil assembly in a cooling medium.

4. A magnetic field generating system according to claim 1, wherein said cancelling magnetic field generating means for disposed substantially symmetrically about the longitudinal axis of said predetermined space.

5. A magnetic field generating system according to claim 1, wherein said cancelling magnetic field generating means include a plurality of cancelling magnetic field generation members.

6. A magnetic field generating system according to claim 5, wherein a plurality of said magnetic field generation members include resistive coils.

7. A magnetic field generating system according to claim 5, wherein a plurality of said cancelling magnetic field generation members are permanent magnets.

8. A magnetic field generating system according to claim 6, further comprising means for adjusting currents flowing through said resistive coils.

9. A magnetic field generating system according to claim 7, wherein said permanent magnet comprises an assembly of small parts.

10. A magnetic field generating system according to claim 4, wherein said cancelling magnetic field generating means include resistive coils and permanent magnets, the permanent magnets being disposed closer to said longitudinal axis than are the resistive coils.

11. A magnetic field generating system according to claim 10, further comprising means for adjusting currents flowing through said resistive coils.

12. A magnetic field generating system according to claim 11, wherein said permanent magnet comprises an assembly of small parts.

13. A magnetic field generating system according to claim 5, which further includes means for moving and adjusting said cancelling magnetic field generating means in said predetermined direction, in a direction orthogonal to said predetermined direction, in a direction orthogonal to both of said previously-mentioned directions.

14. A magnetic field generating system according to claim 1, wherein, said magnetic shield has a shape such that a magnetic flux density passing through said magnetic shield is substantially constant in any position within said magnetic shield.

15. A magnetic field generating system according to claim 1, wherein said magnetic shield has a substantially constant permeability in any position within said magnetic shield.

16. A magnetic field generating system according to claim 1, wherein said magnetic shield is made of a magnetic substance.

17. A magnetic field generating system according to claim 1, wherein said cancelling magnetic field generating means is of a cryostatless type.

* * * * *